US010959351B1

(12) United States Patent
Otte et al.

(10) Patent No.: US 10,959,351 B1
(45) Date of Patent: Mar. 23, 2021

(54) APPARATUS, SYSTEM, AND METHOD FOR DIRECTING AIRFLOW ACROSS HEATSINKS EXTERNAL TO TELECOMMUNICATIONS DEVICES

(71) Applicant: Juniper Networks, Inc., Sunnyvale, CA (US)

(72) Inventors: Christopher Otte, Hollis, NH (US); Jeffery Maki, Dublin, CA (US); Attila I. Aranyosi, Sunnyvale, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 138 days.

(21) Appl. No.: 16/423,008

(22) Filed: May 25, 2019

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ..... *H05K 7/20572* (2013.01); *H05K 7/20418* (2013.01)

(58) Field of Classification Search
CPC .......... H05K 7/20572; H05K 7/20581; H05K 7/20554; H05K 7/20536; H05K 7/20418; H05K 7/20409; H05K 7/2039
See application file for complete search history.

(56) References Cited

U.S. PATENT DOCUMENTS

| | | | |
|---|---|---|---|
| 8,385,850 B1* | 2/2013 | Thompson | G06F 1/182 455/90.3 |
| 10,791,640 B2* | 9/2020 | Lewis, II | H05K 5/0217 |
| 2004/0257766 A1* | 12/2004 | Rasmussen | H05K 7/20736 361/689 |
| 2005/0276017 A1* | 12/2005 | Aziz | H05K 7/20572 361/695 |
| 2007/0064391 A1* | 3/2007 | Lewis, II | H05K 7/20736 361/695 |
| 2009/0227197 A1* | 9/2009 | Lewis, II | H05K 7/20736 454/284 |
| 2009/0311969 A1* | 12/2009 | Wayman | H04B 1/03 455/73 |
| 2012/0025683 A1* | 2/2012 | Mattlin | H05K 5/0226 312/326 |
| 2012/0112612 A1* | 5/2012 | Krietzman | H05K 7/20836 312/236 |
| 2015/0173253 A1* | 6/2015 | Lewis, II | H05K 7/20754 312/223.2 |
| 2015/0208554 A1* | 7/2015 | Leigh | G06F 1/20 165/80.3 |

\* cited by examiner

*Primary Examiner* — Anthony M Haughton
(74) *Attorney, Agent, or Firm* — FisherBroyles, LLP

(57) ABSTRACT

The disclosed apparatus may include (1) a plenum that (A) interfaces with a panel of a telecommunications system that facilitates traffic within a network and (B) reduces a gap between the panel of the telecommunications system and a removable telecommunications module that is installed into the telecommunications system and (2) an air channel that is incorporated in the plenum, wherein the air channel directs airflow into a vent hole of the panel of the telecommunications system. Various other apparatuses, systems, and methods are also disclosed.

20 Claims, 7 Drawing Sheets

US 10,959,351 B1

APPARATUS, SYSTEM, AND METHOD FOR DIRECTING AIRFLOW ACROSS HEATSINKS EXTERNAL TO TELECOMMUNICATIONS DEVICES

Heatsinks are often a critical component of electronic and mechanical devices. For example, a telecommunications device (such as a router) may house various optical modules that facilitate forwarding traffic from one device to another within a network. If the operating temperature of these optical modules rises above a certain level, they may overheat, malfunction, or even break. To prevent such issues, these optical modules may be equipped with heatsinks designed to transfer and/or dissipate heat. These heatsinks may include thermally conductive material that transfers heat away from the optical modules, thereby cooling the optical modules and/or enabling them to achieve higher performance.

In some designs, the heatsinks may be coupled to the portion of these optical modules that remains exposed external to the telecommunications device after installation. Unfortunately, such designs may have certain drawbacks and/or deficiencies that impair the heat-transfer capabilities of the heatsinks when installed in the telecommunications device. For example, to achieve peak performance of an external heatsink coupled to an optical module, a telecommunications device may implement a forced convection cooling mechanism that involves passing airflow across the external heatsink. However, a gap may form and/or exist between the trailing edge of the external heatsink and an airflow inlet on the chassis of the telecommunications device. In this example, the gap may interrupt and/or interfere with the airflow, thus causing the airflow to bypass the heatsink. Such bypass may limit the heat-transfer capabilities of the heatsink and in turn impede the performance of the optical module.

The instant disclosure, therefore, identifies and addresses a need for additional and improved apparatuses, systems, and methods for directing airflow across heatsinks external to telecommunications devices.

SUMMARY

As will be described in greater detail below, the instant disclosure generally relates to apparatuses, systems, and methods for directing airflow across heatsinks external to telecommunications devices. In one example, an apparatus for accomplishing such a task may include (1) a plenum that (A) interfaces with a panel of a telecommunications system that facilitates traffic within a network and (B) reduces a gap between the panel of the telecommunications system and a removable telecommunications module that is installed into the telecommunications system and (2) an air channel that is incorporated in the plenum, wherein the air channel directs airflow into a vent hole of the panel of the telecommunications system.

Similarly, a system incorporating the above-described apparatus may include (1) a telecommunications device that facilitates traffic within a network and (2) a plenum that (A) interfaces with a panel of the telecommunications device and (B) reduces a gap between the panel of the telecommunications device and a removable telecommunications module that is installed into the telecommunications device and (2) an air channel that is incorporated in the plenum, wherein the air channel directs airflow into a vent hole of the panel of the telecommunications device.

A corresponding method may include (1) forming an air channel in a plenum for attachment to a panel of a telecommunications device, (2) attaching the plenum to the panel of the telecommunications device, (3) installing a removable telecommunications module into the telecommunications device via the panel of the telecommunications device such that a heatsink coupled to the removable telecommunications module resides proximate to the air channel formed in the plenum, and then (4) reducing, by way of the plenum attached to the panel of the telecommunications device, a gap between the panel of the telecommunications device and the heatsink attached to the removable telecommunication module.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
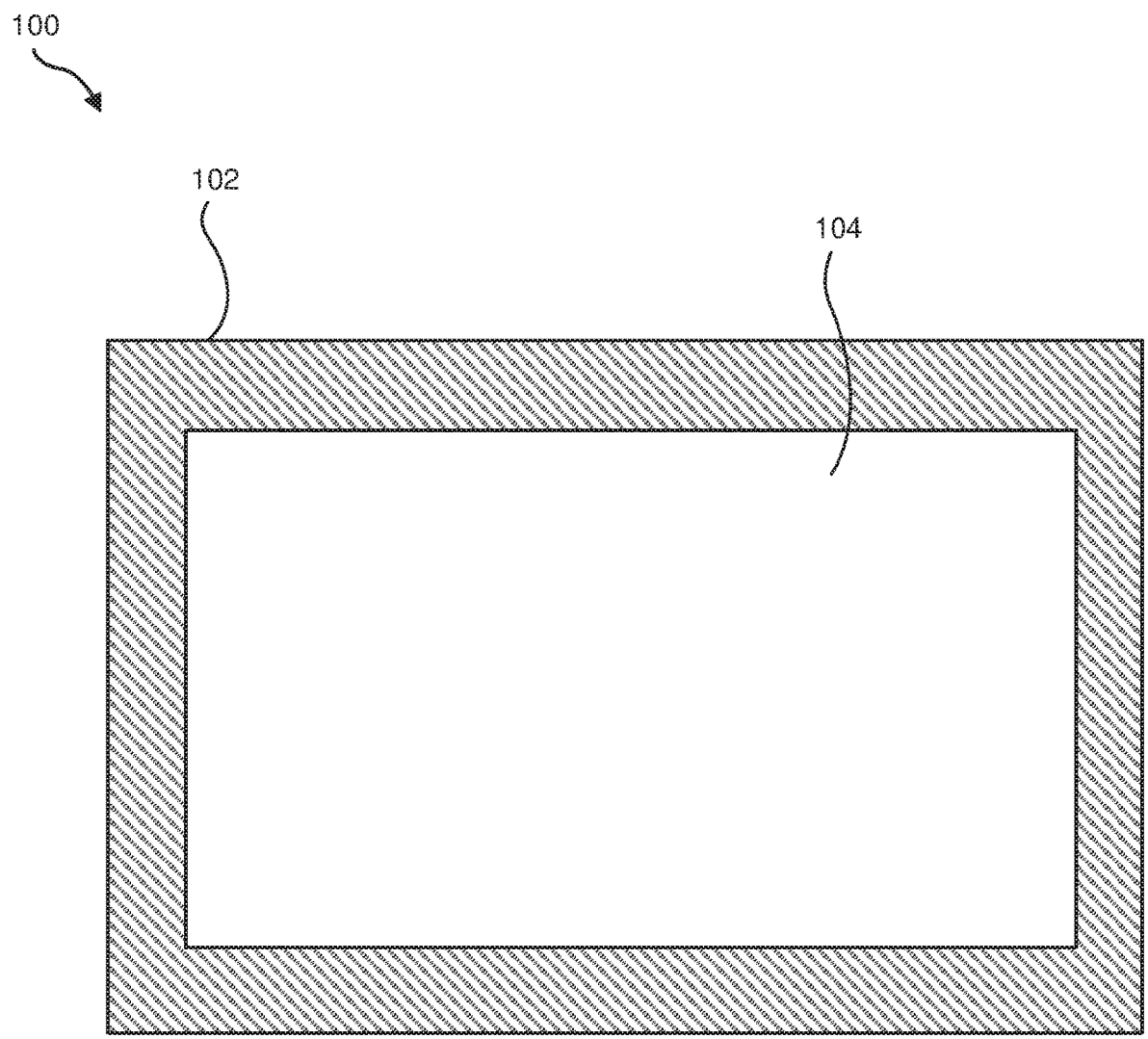
FIG. 1 is an illustration of an exemplary apparatus for directing airflow across heatsinks external to telecommunications devices.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for directing airflow across heatsinks external to telecommunications devices. As will be explained in greater detail below, embodiments of the instant disclosure may reduce, close, and/or bridge a gap that would otherwise form and/or exist between a panel of a telecommunications system and a removable telecommunications module installed in the telecommunications system. By doing so, these embodiments may effectively prevent airflow intended for an external heatsink coupled to the removable telecommunications module from bypassing the external heatsink. As a result, these embodiments may be able to improve forced convection cooling techniques applied to such external heatsinks. In turn, these embodiments may be able to improve the performance of the corresponding removable telecommunications modules.

Additionally or alternatively, embodiments of the instant disclosure may be able to compensate for designs in which an external heatsink coupled to a removable telecommunications module does not align with the corresponding vent hole or inlet for the heatsink's airflow. For example, if the vent hole and/or inlet for an external heatsink's airflow is raised above the level of the external heatsink, embodiments of the instant disclosure may incorporate a ramp that guides the airflow from an external heatsink upward toward the raised vent hole and/or inlet. By doing so, these embodiments may increase the suction, vacuum, and/or pressure of forced convection cooling techniques applied to such external heatsinks. As a result, these embodiments may be able to improve the effectiveness of forced convection cooling techniques applied to such external heatsinks. In turn, these embodiments may be able to improve the performance of the corresponding removable telecommunications modules.

The following will provide, with reference to FIGS. 1, 2, 5, and 6, detailed descriptions of exemplary apparatuses, systems, and/or implementations that facilitate directing airflow across heatsinks external to telecommunications devices. Detailed descriptions of an exemplary telecommunications system and an exemplary removable telecommunications module will be provided in connection with FIGS. 3 and 4, respectively. Finally, the discussion corresponding to FIG. 7 will provide a detailed description of an exemplary method for directing airflow across heatsinks external to telecommunications devices.

FIG. 1 illustrates a cross-section of an exemplary apparatus 100 for directing airflow across heatsinks external to telecommunications devices. As illustrated in FIG. 1, exemplary apparatus 100 may include and/or represent a plenum 102 intended to extend from a panel of a telecommunications system. In some examples, plenum 102 may incorporate and/or form an air channel 104. In one example, when applied to and/or installed on a panel of a telecommunications system, plenum 102 may be able to effectively reduce, close, and/or bridge the gap between the panel and a heatsink coupled to an external portion of a removable telecommunications module installed in the telecommunications system. In this example, air channel 104 may carry and/or support airflow that passes from one side of the telecommunications system to another as part of the system's forced convection cooling mechanism.

Plenum 102 may include and/or contain a variety of different materials. In one example, plenum 102 may be composed of a foam material. Additional examples of materials that may form part of plenum 102 include, without limitation, metals, plastics, ceramics, polymers, composites, combinations or variations of one or more of the same, and/or any other suitable materials. In addition, plenum 102 may be of any suitable dimensions.

Air channel 104 may include and/or represent a tube, passage, airway, and/or tunnel incorporated into and/or formed by or within plenum 102. In one example, air channel 104 may serve to direct, redirect, and/or guide airflow from the trailing edge of a heatsink coupled to an external portion of a removable telecommunications module to a vent hole and/or inlet incorporated into and/or formed by or within a panel of a telecommunications system. In this example, air channel 104 may represent a link within a chain of passageways through which airflow is carried from one side of the telecommunications system to another. These passages may represent part of the telecommunications system's forced convection cooling mechanism, which causes and/or generates airflow that passes over the heatsink coupled to the external portion of the removable telecommunications module.

In some examples, plenum 102 may serve as part of an inlet or outlet for the telecommunications system's forced convection cooling mechanism-depending on the direction of the airflow passing from one side of the telecommunications system to another. For example, if airflow is travelling into the telecommunications system by way of plenum 102, plenum 102 may be serving as part of an inlet and/or source for the telecommunications system's forced convection cooling mechanism. However, if airflow is travelling out of the telecommunications system by way of plenum 102, plenum 102 may be serving as part of an outlet and/or exhaust for the telecommunications system's forced convection cooling mechanism. In one embodiment, plenum 102 may not need any ribs and/or screening because plenum 102 is ultimately attached to the telecommunications system outside of the ElectroMagnetic Interference (EMI) boundary.

Figure 2:
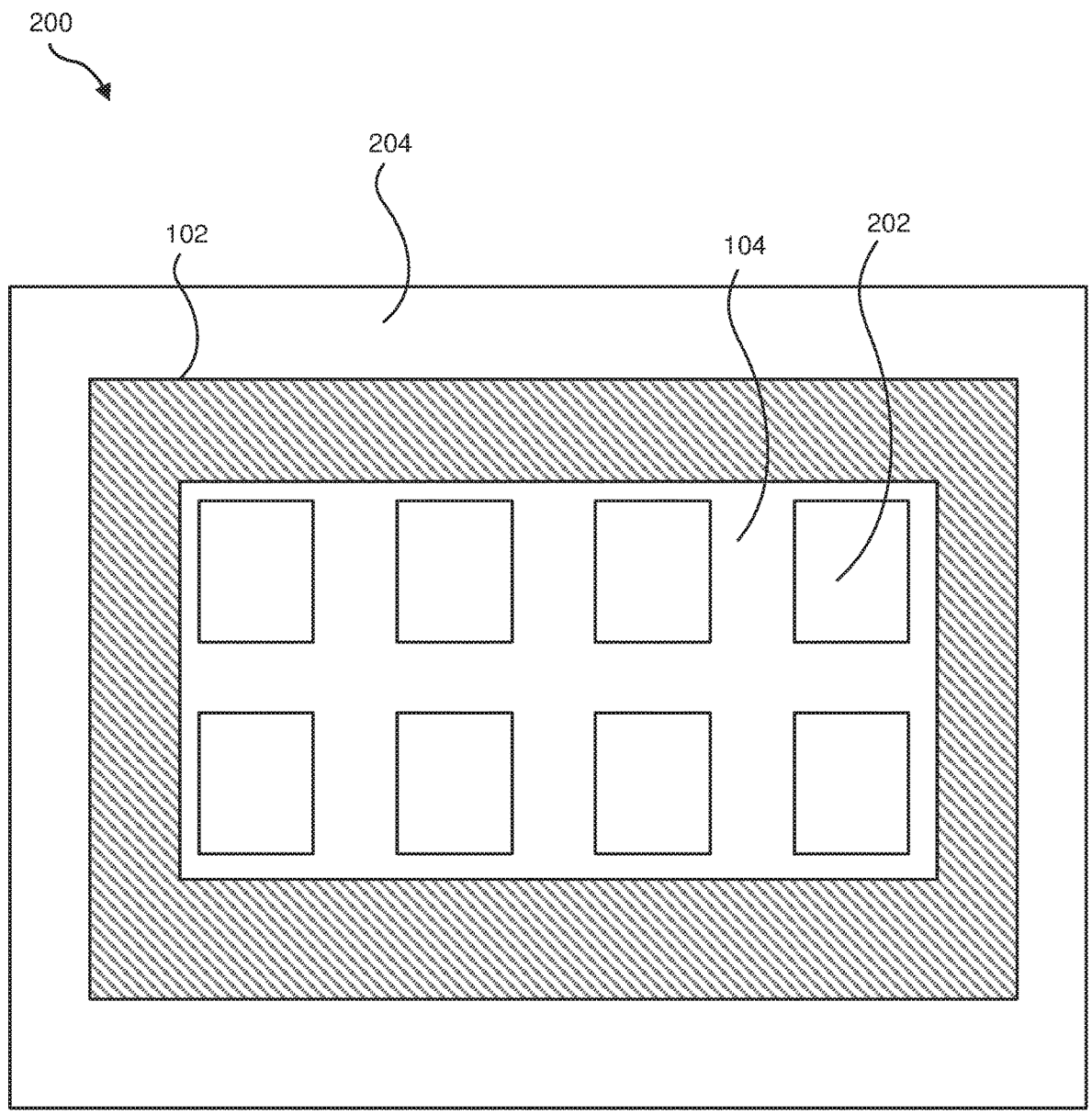
FIG. 2 is an illustration of an exemplary system for directing airflow across heatsinks external to telecommunications devices.

FIG. 2 illustrates an exemplary system 200 for directing airflow across heatsinks external to telecommunications devices. As illustrated in FIG. 2, exemplary system 200 may include and/or represent plenum 102 and a panel 204 of a telecommunications system. In some examples, plenum 102 may interface with and/or be coupled to panel 204. In such examples, air channel 104 incorporated into and/or formed by plenum 102 may lead to one or more vent holes, such as vent hole 202. In one example, vent hole 202 may represent and/or serve as an inlet and/or source for airflow passing through the telecommunications system as part of the system's forced convection cooling mechanism. In another example, vent hole 202 may represent and/or serve as an outlet and/or exhaust for airflow passing through the telecommunications system as part of the system's forced convection cooling mechanism.

In some examples, panel 204 may include and/or represent a front panel and/or surface of the telecommunications system. In other words, panel 204 may include various ports and/or cages where removable telecommunications modules (such as optical transceivers) are installed and/or uninstalled. In one example, vent hole 202 may be incorporated into and/or formed by or within panel 204. In this example, vent hole 202 may be located proximate to a port and/or cage that integrated into panel 204 and/or configured to accept installation of a removable telecommunications module. In one embodiment, Plenum 102 may be secured, attached, and/or coupled to panel 204 in a variety of ways. In some examples, plenum 102 may attached to panel 204 by way of an adhesive. For example, plenum 102 may be attached to panel 204 by way of a Pressure-Sensitive Adhesive (PSA) and/or self-stick adhesive. Alternatively, plenum 102 may be attached to panel 204 by way of any other suitable attachment mechanism. Examples of such alternative attachment mechanisms include, without limitation, fasteners, locks, pins, screws, levers, joints, ties, clamps, clasps, stitches, staples, magnets, variations or combinations of one or more of the same, and/or any other suitable attachment means.

Figure 3:
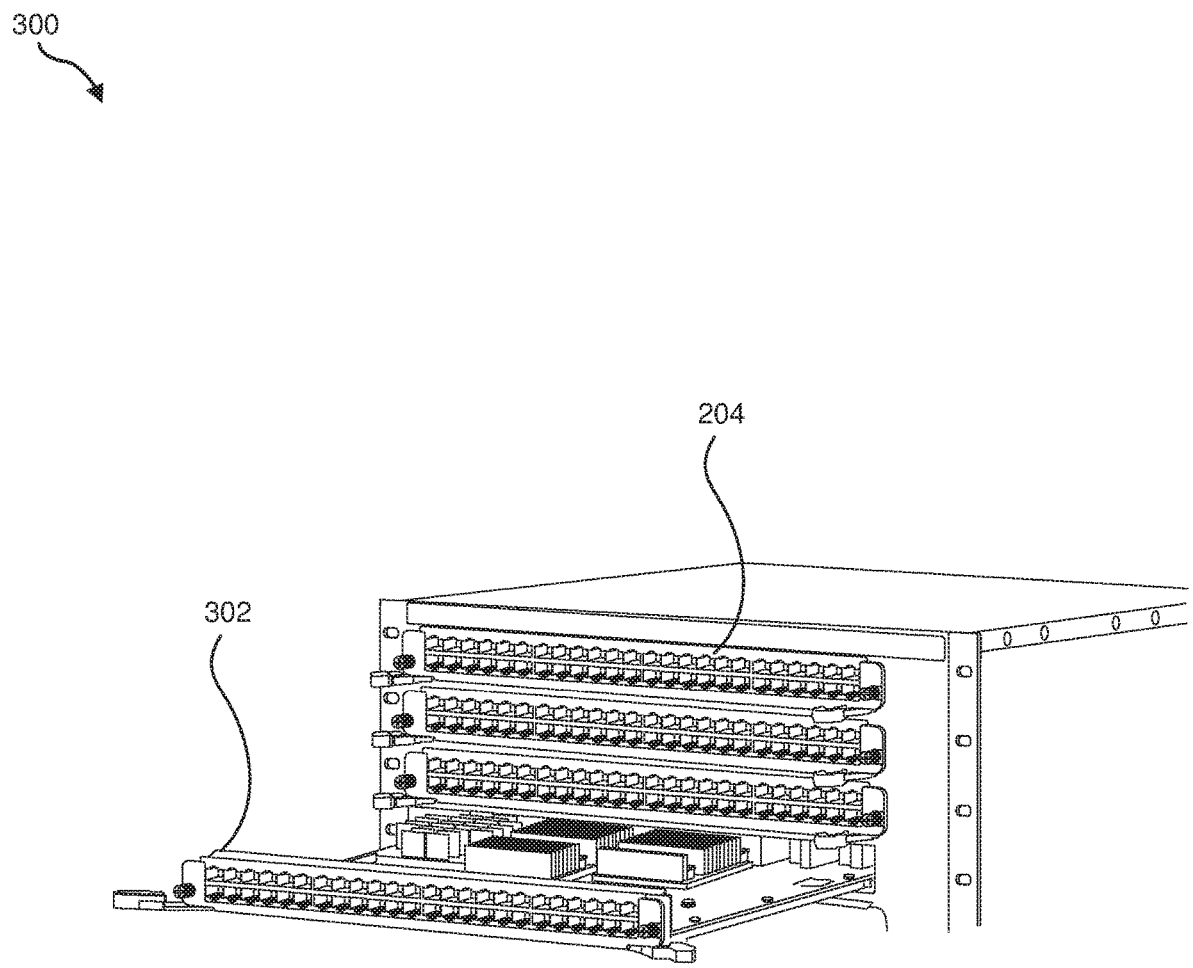
FIG. 3 is an illustration of an exemplary telecommunications system that facilitates traffic within a network.

FIG. 3 illustrates an exemplary telecommunications system 300 that facilitates forwarding traffic among a network of computing devices. As illustrated in FIG. 3, telecommunications system 300 may include one or more line cards, such as line card 302. In this example, line card 302 may include various ports that house removable telecommunications modules. In addition, telecommunications system 300 may include panel 204. Although not illustrated in FIG. 3, apparatus 100 may be incorporated into telecommunications system 300 and/or attached to telecommunications system 300 at panel 204.

In one example, telecommunications system 300 may include and/or represent a router (such as a provider edge router, hub router, spoke router, autonomous system boundary router, and/or area border router) that receives, routes, forwards, and/or otherwise handles network traffic. Additional examples of telecommunications system 300 include, without limitation, switches, hubs, modems, bridges, repeaters, gateways, multiplexers, network adapters, network interfaces, client devices, laptops, tablets, desktops, servers, variations or combinations of one or more of the same, and/or any other suitable network devices.

Figure 4:
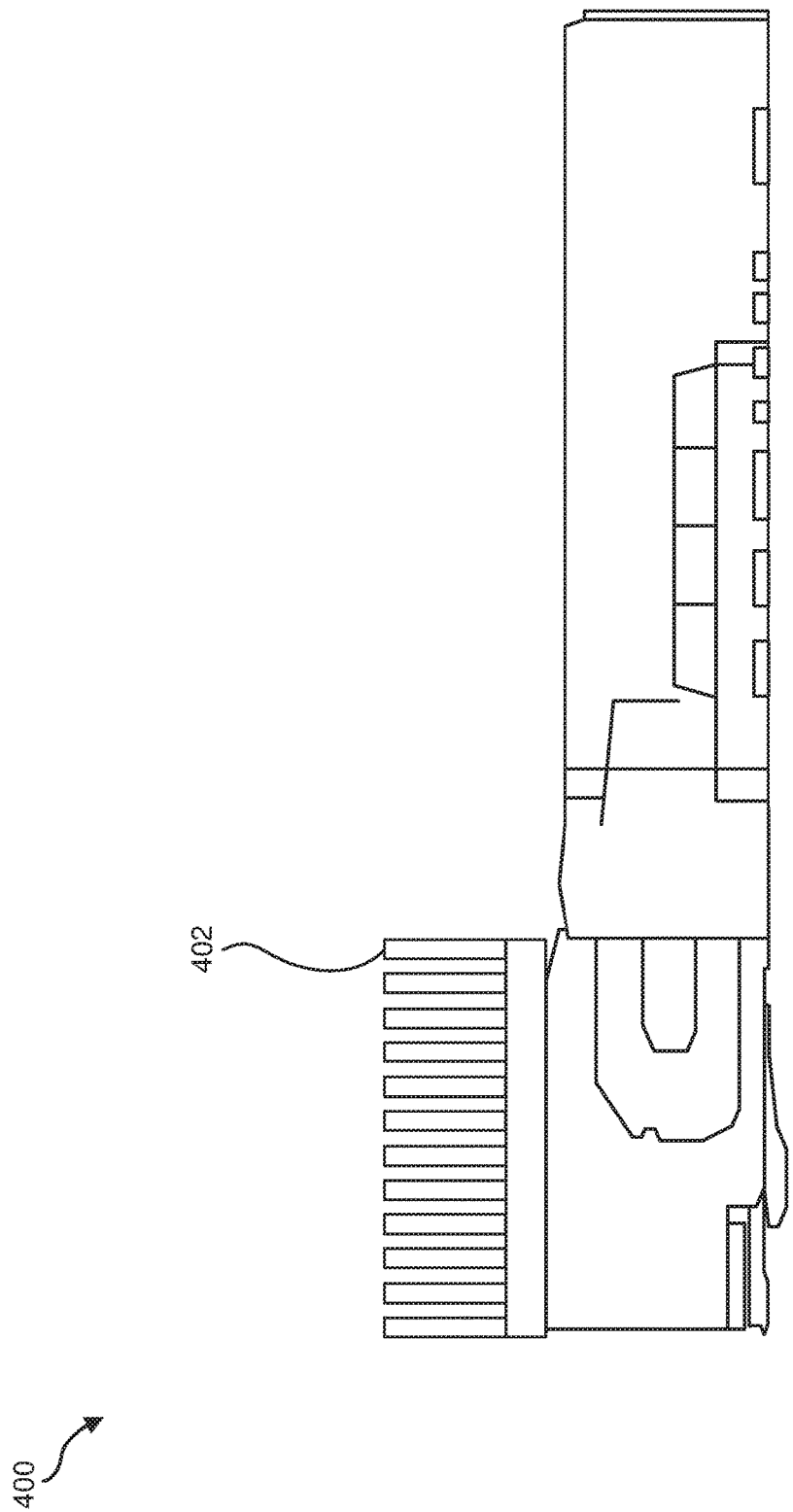
FIG. 4 is an illustration of an exemplary removable telecommunications module that is installable within a telecommunications system.

FIG. 4 illustrates an exemplary removable telecommunications module 400 that is installable within a port and/or cage of panel 204 on telecommunications system 300. In some examples, removable telecommunications module 400 may include and/or represent a Field-Replaceable Unit (FRU) that is hot-removable, hot-insertable, hot-pluggable, and/or hot-swappable. In one example, removable telecommunications module 400 may include and/or a physical interface that carries and/or forwards traffic within a network and/or across multiple networks in connection with telecommunications system 300.

In some examples, removable telecommunications module 400 may correspond to, represent, and/or be responsible for the data plane and/or forwarding plane of telecommunications system 300. In one example, removable telecommunications module 400 may include and/or represent an optical transceiver and/or optical transducer in a fiber optic system. For example, removable telecommunications module 400 may include and/or represent a (1) a transmitter that uses light (e.g., a laser) to transmit data via a fiber optic channel and/or (2) a detector that detects light to receive data via a fiber optic channel.

Removable telecommunications module 400 may be of various shapes and/or dimensions. In some examples, removable telecommunications module 400 may be formed in a Small Form-Factor (SFP) pluggable package and/or Quad SFP (QSFP) pluggable package. For example, removable telecommunications module 400 may include and/or represent a Type 1, Type 2, and/or Type 3 QSFP module, as defined by the QSFP-DD Multi-Source Agreement (MSA). In one example, removable telecommunications module 400 may support SONET, GIGABIT ETHERNET, FIBRE CHANNEL, and/or other communications standards. Additionally or alternatively, removable telecommunications module 400 may plug into SFP and/or QSFP sockets, ports, and/or cages. Removable telecommunications module 400 may be communicatively coupled to other computing devices via a fiber optic, copper, and/or other network cable. In this way, removable telecommunications module 400 may enable telecommunications system 300 to communicate with such devices within the same network and/or across multiple networks.

As illustrated in FIG. 4, removable telecommunications module 400 may include and/or be equipped with a heatsink 402. In some examples, heatsink 402 may include and/or represent a device, structure, and/or mechanism that conducts, transfers, absorbs, and/or sinks heat. Heatsink 402 may be designed for the specific purpose of conducting, transferring, absorbing, and/or sinking heat. In one example, heatsink 402 may be physically attached, secured, and/or coupled to a portion of removable telecommunications module 400 that remains external to the chassis of telecommunications system 300 even after installation.

Heatsink 402 may be of various shapes and/or dimensions. In some examples, heatsink 402 may form a square, a rectangle, and/or a cube. Additional examples of shapes formed by heatsink 402 include, without limitation, ovals, circles, triangles, diamonds, parallelograms, variations or combinations of one or more of the same, and/or any other suitable shapes. In one example, heatsink 402 may include and/or incorporate a finned and/or pin fin configuration, design, and/or structure.

In some examples, heatsink 402 may be sized in a particular way to maximize the amount of heat transferred from the removable telecommunications module 400. Heatsink 402 may include and/or contain a variety of materials. Examples of such heatsink materials include, without limitation, copper, aluminum, diamond, alloys of one or more of the same, combinations or variations of one or more of the same, and/or any other suitable materials.

Figure 5:
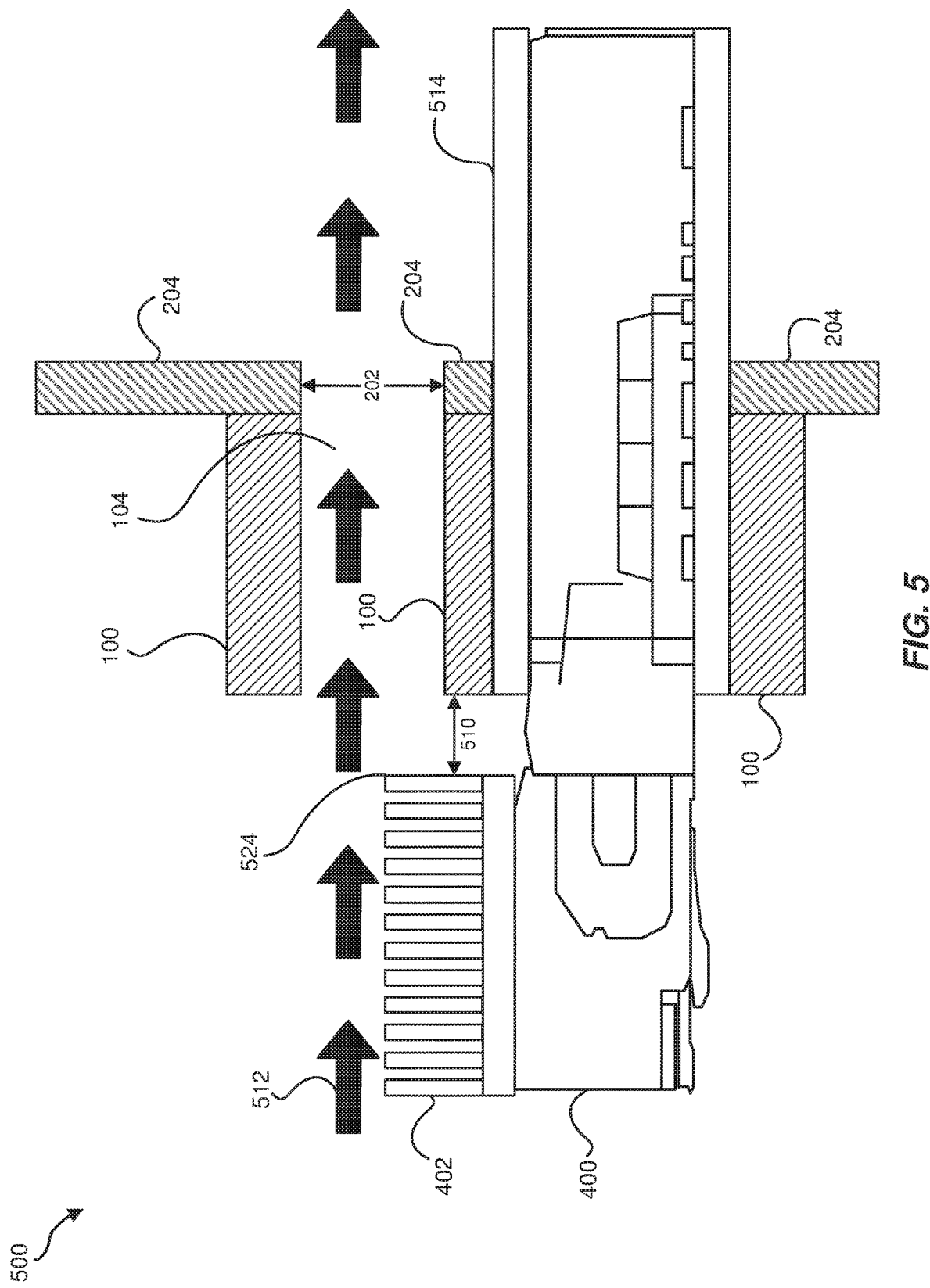
FIG. 5 is an illustration of is an exemplary system for directing airflow across heatsinks external to telecommunications devices.

FIG. 5 illustrates an exemplary system 500 for directing airflow across heatsinks external to telecommunications devices. As illustrated in FIG. 5, system 500 may include plenum 102 attached, secured, and/or coupled to panel 204 of telecommunications system 300. In some examples, system 500 may include a cage 514 into which removable telecommunications module 400 is installed. Accordingly, cage 514 may represent part of and/or be included in telecommunications system 300. In such examples, plenum 102 may be applied and/or installed around cage 514 such that plenum 102 at least partially envelops and/or surrounds cage 514. In one example, heatsink 402 coupled to removable telecommunications module 400 may remain external to and/or outside telecommunications system 300 even after removable telecommunications module 400 is installed in cage 514.

In some examples, plenum 102 may extend outward from panel 204 toward a trailing edge 524 of heatsink 402. In one example, a gap 510 may remain and/or exist between plenum 102 and trailing edge 524 of heatsink 402 even after removable telecommunications module 400 is installed in cage 514. In this example, plenum 102 may effectively reduce, close, and/or bridge gap 510 between panel 204 and trailing edge 524 of heatsink 402. Accordingly, plenum 102 may serve to extend panel 204 and/or vent hole 202 closer to trailing edge 524 of heatsink 402, thereby reducing and/or minimizing gap 510.

By doing so, plenum 102 may support airflow 512 that passes over heatsink 402 coupled to the external portion of removable telecommunications module 400. Put another way, plenum 102 may prevent airflow 512 intended for heatsink 402 from bypassing heatsink 402. For example, plenum 102 may reduce gap 510 between heatsink 402 and the chassis of telecommunications system 300. In other words, plenum 102 may reduce the size of the gap that would otherwise form and/or exist between heatsink 402 and the chassis of telecommunications system 300. This reduced gap 510 may mitigate bypass to ensure that airflow 512 is directed across heatsink 402.

In some examples, plenum 102 may be configured, designed, and/or implemented such that gap 510 is less than or equal to 1 millimeter. In other examples, plenum 102 may be configured, designed, and/or implemented such that gap 510 is less than or equal to 700 microns. Accordingly, plenum 102 may ensure that gap 510 is less than or equal to 1 millimeter or 700 microns. By doing so, plenum 102 may enable system 500 to comply with a maximum permissible gap between heatsink 402 and panel 204, as defined by the QSFP-DD MSA.

In one example, airflow 512 may be generated and/or produced by a forced convection cooling mechanism of telecommunications system 300. In this example, plenum 102 may be able to improve the forced convection cooling mechanism such that airflow 512 passes over heatsink 402 instead of being interrupted and/or diverted by gap 510. As a result, plenum 102 may also improve the heat-transfer capabilities of heatsink 402. In some embodiments, this forced convection cooling mechanism may draw and/or force airflow 512 into vent hole 202 by way of fans, pumps, suction devices, etc.

In some examples, plenum 102 may form part of a vacuum that sucks airflow 512 across heatsink 402 into air channel 104 and then through vent hole 202. As illustrated in FIG. 5, air channel 104 formed by plenum 102 may direct airflow 512 into vent hole 202. In this example, vent hole 202 may serve as an inlet for the forced convection cooling mechanism of telecommunications system 300. For example, because airflow 512 is travelling into telecommunications system 300 by way of plenum 102, vent hole 202 may serve as the chassis inlet for the forced convection cooling mechanism of telecommunications system 300.

However, although not illustrated in this way in FIG. 5, vent hole 202 may alternatively serve as an exhaust for the forced convection cooling mechanism of telecommunications system 300. For example, if airflow 512 were travelling out of telecommunications system 300 by way of plenum 102, vent hole 202 may be serving as the chassis exhaust for the forced convection cooling mechanism of telecommunications system 300.

In some examples, air channel 104 may represent and/or serve as a remix zone in which airflow 512 remixes as part of the forced convection cooling cycle. In one example, the remix zone may be able to remix airflow 512 between trailing edge 524 of heatsink 402 and vent hole 202. In this example, the remixing may effectively cool airflow 512 before the same reaches one or more components internal to and/or inside the chassis of telecommunications system 300 as part of the forced convection cooling mechanism.

Figure 6:
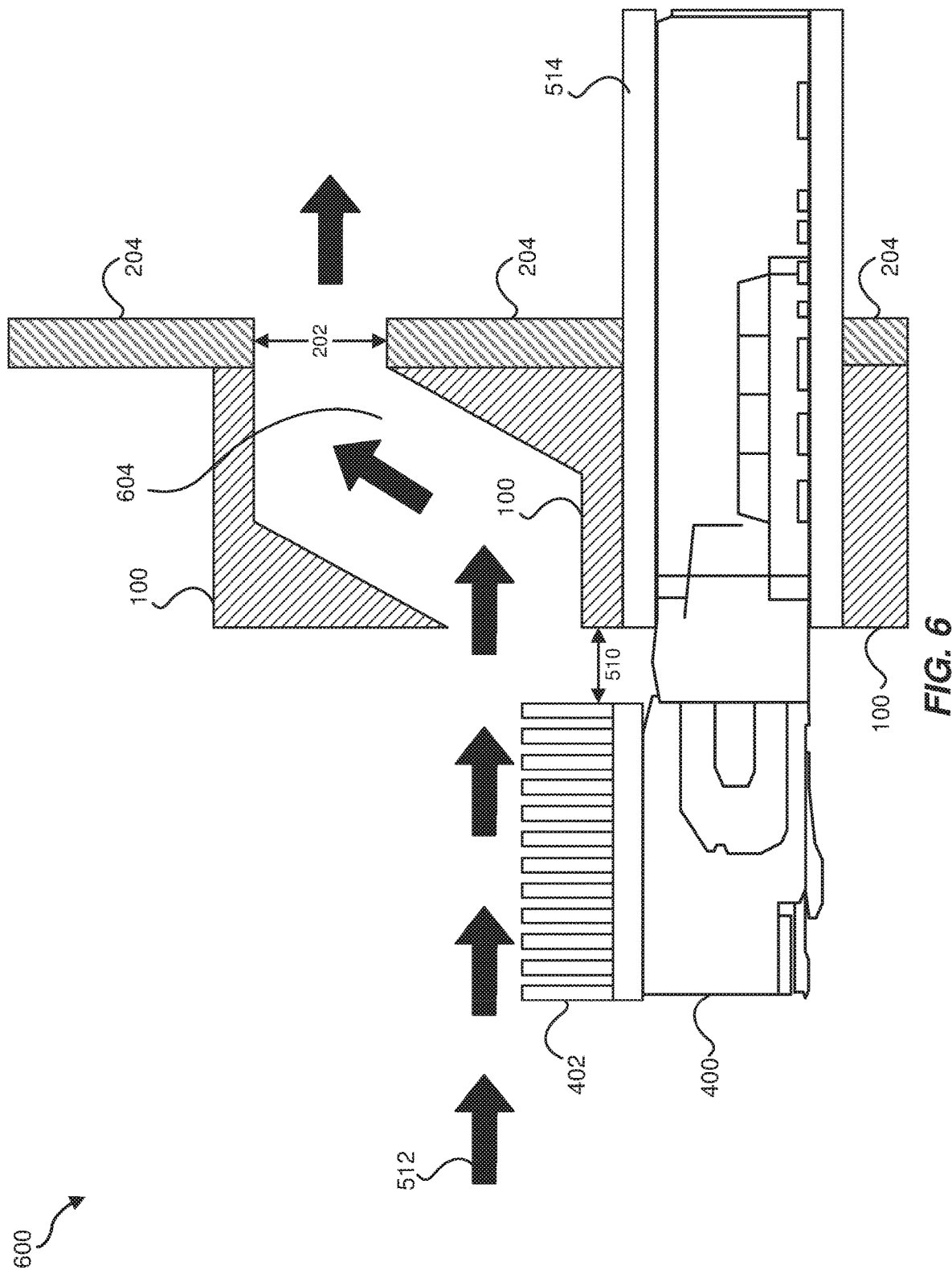
FIG. 6 is illustration of an exemplary system for directing airflow across heatsinks external to telecommunications devices.

FIG. 6 illustrates an exemplary system 600 for directing airflow across heatsinks external to telecommunications devices. As illustrated in FIG. 6, system 600 may include plenum 102 attached, secured, and/or coupled to panel 204 of telecommunications system 300. In some examples, system 600 in FIG. 6 may perform and/or achieve any and/or all of the same functions or features as system 500 in FIG. 5. Accordingly, system 600 in FIG. 6 may provide and/or offer any and/or all of the same benefits and/or advantages as system 500 in FIG. 5.

In addition, system 600 may incorporate and/or include a version of plenum 102 whose air channel 104 is formed into a ramp 604. For example, air channel 104 of plenum 102 in FIG. 6 may constitute and/or implement ramp 604 that guides airflow 512 from heatsink 402 to vent hole 202 along a slope. In this example, the slope of ramp 604 may compensate for a design in which heatsink 402 and vent hole 202 are not aligned with one another. Accordingly, plenum 102 in FIG. 6 may be used to link and/or connect disjointed segments of the air passageway that facilitates and/or supports airflow 512 in connection with the forced convection cooling mechanism of telecommunications system 300.

As an example, if vent hole 202 is raised and/or located above the level of heatsink 402, ramp 604 may guide airflow 512 from heatsink 402 upward toward vent hole 202. By doing so, ramp 604 may increase the suction, vacuum, and/or pressure of forced convection cooling techniques applied to heatsink 402. As a result, ramp 604 may be able to improve the effectiveness of forced convection cooling techniques applied to heatsink 402.

In some examples, ramp 604 may guide airflow 512 in an oblique direction and/or along an oblique angle relative to the orientation of removable telecommunications module 400 after installation. For example, if removable telecommunications module 400 is installed into cage 514 along a horizontal plane (as illustrated in FIG. 6), then ramp 604 may direct airflow 512 upward in an oblique direction and/or along an oblique angle relative to that horizontal plane. In one example, airflow 512 may return to running along that horizontal plane after passing through plenum 102 and/or vent hole 202.

In some examples, plenum 102 may be used to retrofit preexisting telecommunications systems and/or improve their forced convection cooling mechanisms. For example, if telecommunications system 300 supports Type 1 and/or Type 2 QSFP modules, the application and/or installation of plenum 102 on telecommunications system 300 may constitute and/or amount to an upgrade that enables telecommunications system 300 to also support Type 3 QSFP modules. Additionally or alternatively, the application and/or installation of plenum 102 on telecommunications system 300 may enable Type 2 and/or Type 3 QSFP modules to comply with one or more standards defined by the QSFP-DD MSA.

Figure 7:
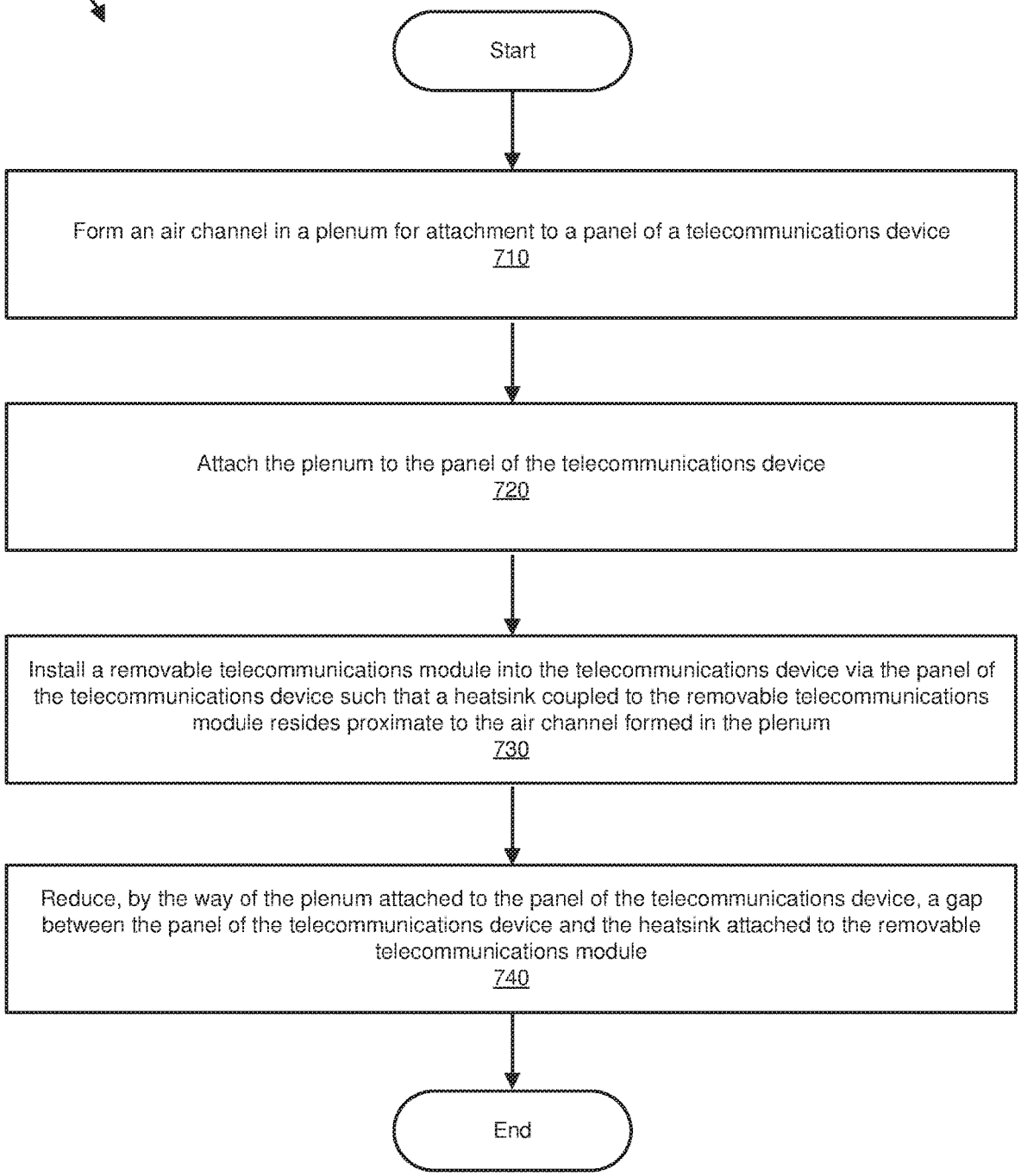
FIG. 7 is a flow diagram of an exemplary method for directing airflow across heatsinks external to telecommunications devices.

FIG. 7 is a flow diagram of an exemplary method 700 for directing airflow across heatsinks external to telecommunications devices. Method 700 may include the step of forming an air channel in a plenum for attachment to a panel of a telecommunications device (710). Step 710 may be performed in a variety of ways, including any of those described above in connection with FIGS. 1-6. For example, a computing equipment manufacturer or subcontractor may machine air channel 104 within plenum 102 by extracting material from plenum 102. Additionally or alternatively, the computing equipment manufacturer or subcontractor may form and/or mold air channel 104 into plenum 102.

Method 700 may also include the step of attaching plenum to the panel of the telecommunications device (720). Step 720 may be performed in a variety of ways, including any of those described above in connection with FIGS. 1-6. For example, the computing equipment manufacturer or subcontractor may mount and/or couple plenum 102 to panel 204 of telecommunications system 300 by way of an adhesive. Alternatively, a network administrator responsible for telecommunications system 300 may mount and/or couple plenum 102 to panel 204 of telecommunications system 300 by way of an adhesive.

Method 700 may further include the step of installing a removable telecommunications module into the telecommunications device via the panel of the telecommunications device such that a heatsink coupled to the removable telecommunications module resides proximate to the air channel formed in the plenum (730). Step 730 may be performed in a variety of ways, including any of those described above in connection with FIGS. 1-6. For example, the computing equipment manufacturer or subcontractor may install removable telecommunications module 400 into cage 512 of telecommunications device 300 such that heatsink 402 resides and/or sits proximate to (e.g., within 1 millimeter of) air channel 104 of plenum 102. Alternatively, a network administrator responsible for telecommunications system 300 may install removable telecommunications module 400 into cage 514 of telecommunications device 300 such that heatsink 402 resides and/or sits proximate to (e.g., within 1 millimeter of) air channel 104 of plenum 102.

Method 700 may additionally include the step of reducing, by way of the plenum attached to the panel of the telecommunications device, a gap between the panel of the telecommunications device and the heatsink attached to the removable telecommunication module (740). Step 740 may be performed in a variety of ways, including any of those described above in connection with FIGS. 1-6. For example, plenum 102 may reduce the gap between panel 204 and heatsink 402 coupled to removable telecommunications module 400. In this example, plenum 102 may serve to extend panel 204 toward heatsink 402 to prevent airflow 512 from being interrupted and/or bypassing heatsink 402 as part of the forced conduction cooling implemented on telecommunications system 300.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    a plenum that:
        interfaces with a panel of a telecommunications system that facilitates traffic within a network; and
        reduces a gap between the panel of the telecommunications system and a removable telecommunications module that is installed into the telecommunications system; and
    an air channel that is incorporated in the plenum, wherein the air channel directs airflow into a vent hole of the panel of the telecommunications system.

2. The apparatus of claim 1, wherein the plenum reduces the gap between the panel of the telecommunications system and a heatsink coupled to the removable telecommunications module to less than or equal to 1 millimeter.

3. The apparatus of claim 2, wherein the reduced gap mitigates bypass to ensure that the airflow is directed across the heatsink coupled to the removable telecommunications module.

4. The apparatus of claim 1, wherein the air channel comprises a ramp that guides the airflow from a heatsink coupled to the removable telecommunications module to the vent hole along a slope that compensates for a design in which the heatsink and the vent hole are not aligned with one another.

5. The apparatus of claim 1, wherein the air channel comprises a remix zone in which the airflow remixes as part of a forced convection cooling cycle between a heatsink coupled to the removable telecommunications module and the vent hole.

6. The apparatus of claim 1, wherein the plenum is composed of a foam material.

7. The apparatus of claim 1, wherein the plenum is adhered to the panel of the telecommunications system by way of an adhesive.

8. The apparatus of claim 1, wherein the plenum is retrofitted to the telecommunications system.

9. The apparatus of claim 1, wherein the removable telecommunications module comprises a Quad Small Form-factor Pluggable (QSFP) module.

10. The apparatus of claim 1, wherein the plenum forms a vacuum that sucks the airflow across a heatsink coupled to the removable telecommunications module.

11. A system comprising:
    a telecommunications device that facilitates traffic within a network;
    a plenum that:
        interfaces with a panel of the telecommunications device; and
        reduces a gap between the panel of the telecommunications device and a removable telecommunications module that is installed into the telecommunications device; and
    an air channel that is incorporated in the plenum, wherein the air channel directs airflow into a vent hole of the panel of the telecommunications device.

12. The system of claim 11, wherein the plenum reduces the gap between the panel of the telecommunications device and a heatsink coupled to the removable telecommunications module to less than or equal to 1 millimeter.

13. The system of claim 12, wherein the reduced gap mitigates bypass to ensure that the airflow is directed across the heatsink coupled to the removable telecommunications module.

14. The system of claim 11, wherein the air channel comprises a ramp that guides the airflow from a heatsink coupled to the removable telecommunications module to the vent hole along a slope that compensates for a design in which the heatsink and the vent hole are not aligned with one another.

15. The system of claim 11, wherein the air channel comprises a remix zone in which the airflow remixes as part of a forced convection cooling cycle between a heatsink coupled to the removable telecommunications module and the vent hole.

16. The system of claim 11, wherein the plenum is composed of a foam material.

17. The system of claim 11, wherein the plenum is adhered to the panel of the telecommunications device by way of an adhesive.

18. The system of claim 11, wherein the plenum is retrofitted to the telecommunications device.

19. The system of claim 11, wherein the removable telecommunications module comprises a Quad Small Form-factor Pluggable (QSFP) module.

20. A method comprising:
forming an air channel in a plenum for attachment to a panel of a telecommunications device;
attaching the plenum to the panel of the telecommunications device;
installing a removable telecommunications module into the telecommunications device via the panel of the telecommunications device such that a heatsink coupled to the removable telecommunications module resides proximate to the air channel formed in the plenum; and
reducing, by way of the plenum attached to the panel of the telecommunications device, a gap between the panel of the telecommunications device and the heatsink attached to the removable telecommunication module.

* * * * *